United States Patent
Colombo

(10) Patent No.: US 8,368,247 B2
(45) Date of Patent: Feb. 5, 2013

(54) SEMICONDUCTOR BODY AND METHOD FOR VOLTAGE REGULATION

(75) Inventor: Matteo Colombo, Verrua Po (IT)

(73) Assignee: austriamicrosystems AG, Unterpremstatten (AT)

( * ) Notice: Subject to any disclaimer, the term of this patent is extended or adjusted under 35 U.S.C. 154(b) by 535 days.

(21) Appl. No.: 12/596,486

(22) PCT Filed: Apr. 18, 2008

(86) PCT No.: PCT/EP2008/054755
§ 371 (c)(1), (2), (4) Date: Jan. 21, 2010

(87) PCT Pub. No.: WO2008/129005
PCT Pub. Date: Oct. 30, 2008

(65) Prior Publication Data
US 2010/0109620 A1    May 6, 2010

(30) Foreign Application Priority Data
Apr. 19, 2007    (EP) .................................... 07008024

(51) Int. Cl.
*H02J 1/00*    (2006.01)

(52) U.S. Cl. ........................................... 307/43; 307/103
(58) Field of Classification Search ................... 307/43, 307/103
See application file for complete search history.

(56) References Cited

U.S. PATENT DOCUMENTS

| 7,248,025 B2* | 7/2007 | Adachi | 323/273 |
| 7,274,250 B2* | 9/2007 | Hazucha et al. | 327/539 |
| 7,569,934 B2* | 8/2009 | Akram | 257/737 |
| 2005/0248325 A1 | 11/2005 | Adachi | |
| 2006/0125455 A1 | 6/2006 | Tiew et al. | |

FOREIGN PATENT DOCUMENTS

EP    0 531 945    3/1993

* cited by examiner

*Primary Examiner* — Hal Kaplan
(74) *Attorney, Agent, or Firm* — Cozen O'Connor

(57) ABSTRACT

A semiconductor body (1) comprises a first contact pad (2), a second contact pad (3), an integrated circuit (5) and an impedance (4). The integrated circuit (5) comprises a first terminal (6) which is coupled to the first contact pad (2) and a second terminal (7) which is coupled to the second contact pad (3). The impedance (4) additionally couples the first contact pad (2) to the second contact pad (3).

10 Claims, 4 Drawing Sheets

SEMICONDUCTOR BODY AND METHOD FOR VOLTAGE REGULATION

RELATED APPLICATIONS

This is a U.S. national stage of application No. PCT/EP2008/054755, filed on Apr. 18, 2008.

This application claims the priority of European application no. 07008024.7 filed Apr. 19, 2007, the entire content of which is hereby incorporated by reference.

FIELD OF THE INVENTION

The present invention relates to a semiconductor body and a method for voltage regulation.

BACKGROUND OF THE INVENTION

A semiconductor body with an integrated circuit is often produced in different layouts depending on the type of packaging it is intended for. One version is designed for a chip package which uses bond wires for the connection of the semiconductor body to a lead frame or a printed circuit board, abbreviated PCB. Another version may be used for a packaging process where the semiconductor body is connected to a lead frame or a PCB using flip-chip technology. Two different masks sets are usually used for fabricating the two versions. Since no bond wires are used for the flip-chip technology, the parasitic aspects of bond wires like series resistance and series inductance are avoided in this case.

SUMMARY OF THE INVENTION

It is an object of the present invention to provide a semiconductor body and a method for voltage regulation achieving a high flexibility regarding a packaging method.

This and other objects are attained in accordance with one aspect of the present invention directed to a semiconductor body, comprising a first contact pad, a second contact pad, an integrated circuit with a first terminal which is coupled to the first contact pad and with a second terminal which is coupled to the second contact pad, and an impedance coupling the first contact pad to the second contact pad via a resistive path between the first contact pad and the second contact pad. The semiconductor body is configured such that the semiconductor body is operative irrespective of whether both of said first and second contact pads are electrically contacted during a packaging process or only one of them.

Another aspect of the invention is directed to a method for voltage regulation, comprising the steps of supplying a first voltage to a first contact pad which is coupled to a lead finger, at which an output voltage is provided depending on the first voltage, providing a second voltage at a second contact pad depending on an impedance provided between the first contact pad and the second contact pad and on the first voltage, wherein the impedance couples the first contact pad to the second contact pad via a resistive path between the first contact pad and the second contact pad, generating a feedback voltage by means of the second voltage, and generating the first voltage depending on the feedback voltage and on a reference voltage. The first and second contact pads are on a semiconductor body, and the semiconductor body is configured such that the semiconductor body is operative irrespective of whether the first and second contact pads are electrically contacted during a packaging process or only one of them.

According to an embodiment, a semiconductor body comprises a first contact pad, a second contact pad, an integrated circuit and an impedance. The integrated circuit comprises a first terminal and a second terminal. The first terminal is contacted to the first contact pad and the second terminal is contacted to the second contact pad. Furthermore, the impedance is coupled between the first contact pad and the second contact pad.

It is an advantage of the additional impedance that the first and the second contact pads are coupled together independent from a possible external coupling of the first contact pad to the second contact pad, for example, on a lead frame, a socket or a printed circuit board. Therefore, the semiconductor body can be used in principle irrespective of whether both contact pads are electrically contacted during the packaging process or whether only one of the two contact pads is connected to the lead frame or the PCB. An additional external electrical coupling of the first contact pad to the second contact pad is possible but not required because of the internal coupling of the two contact pads via the impedance. For example, a metallization line of a PCB or a lead finger can be connected to the first contact pad via a first bond wire and to the second contact pad via a second bond wire. By means of two bond wires, an influence of a resistance of the bond wires is advantageously reduced. In another embodiment, the first contact pad can be connected to a metallization line of a PCB or a lead finger without a bond wire by a flip-chip method. Thus, a resistance between the first contact pad and the lead finger is advantageously very low. According to this embodiment, the second contact pad would not be connected to the lead finger or the metallization line, leading to a cost effective packaging.

In a preferred embodiment, the semiconductor body comprises the integrated circuit and in addition to the integrated circuit the impedance. The impedance couples the first contact pad to the second contact pad. The impedance provides a resistive path between the first contact pad and the second contact pad.

In a preferred embodiment, the first and the second contact pads are designed to be electrically contacted from outside of the semiconductor body by means of a lead finger of a lead frame, a pin of a socket or a terminal area of a PCB.

In a preferred embodiment, the two contact pads are designed as two bond pads. Also, a bump can be deposited onto the first contact pad, realised as a bond pad, so that a flip-chip process can alternatively be used for contacting the first contact pad. The bump can be realized as ball.

In an embodiment, the first and the second contact pads comprise a first and a second connection area having a metal film. The two connection areas are comprised by a metallization layer of the semiconductor body. The metallization layer is designed in such a way that the first and the second contact pads are not short-circuited.

In an embodiment, the impedance comprises a switch. Thus, the impedance can have a high resistance value if an electric coupling of the first to the second contact pad is externally realized and can have a low resistance value to achieve an excellent electric coupling of the first and the second contact pads on the semiconductor body.

In an alternative embodiment, the impedance is realized as a fuse. The fuse may be realized in the form of a resistor or a metallization line. The fuse may be programmable using a high current in a so-called burning process. The fuse may alternatively be programmable by a laser cut through the resistor or the metallization line. It is an advantage of a fuse that it shows a stable resistance value without the necessity to apply a control voltage to the impedance.

In an alternative embodiment, the impedance comprises a metallization line. The metallization line has a resistance value depending on the material used and on the geometry of the metallization line.

In a preferred embodiment, the impedance comprises a resistor. It is an advantage of the resistor that a flow of a high current between the two contact pads is avoided. The resistor can be designed as a transistor which is connected like a resistor. The resistor can alternatively be realized as a diffused resistor. The resistor can preferably be designed as a thin film resistor. The thin film may comprise a metal or poly silicon.

In an embodiment, an arrangement comprises the semiconductor body and a lead frame with a lead finger. A lead finger can also be described as a lead frame finger. In a first development, the lead finger is connected to the first contact pad via a flip-chip connection. The flip-chip connection may comprise a bump between the first contact pad and the lead finger. In a second development, a first bond wire is arranged between the first contact pad and the lead finger and a second bond wire is arranged between the second contact pad and the lead finger.

In an embodiment, a method for voltage regulation comprises to supply a first voltage to a first contact pad. The first contact pad is coupled to a lead finger. An output voltage is provided at the lead finger depending on the first voltage. A second voltage is generated at a second contact pad depending on an impedance provided between the first contact pad and the second contact pad and on the first voltage. A feedback voltage is provided depending on the second voltage. The first voltage depends on the feedback voltage and on a reference voltage.

It is an advantage of the method that the feedback voltage can be generated by electrical coupling the first contact pad to the second contact pad via the impedance. Optionally, the second contact pad can be directly connected to the lead finger using wire bonding.

In one embodiment, the impedance connects the first contact pad to the second contact pad. The impedance causes a resistive path between the first contact pad and the second contact pad.

The following description of figures of exemplary embodiments may further illustrate and explain the invention. Devices with the same structure or with the same effect appear with equivalent reference numerals. A description of a part of a circuit or a device having the same function in different figures might not be repeated in each of the following figures.

DETAILED DESCRIPTION OF THE DRAWINGS

Figure 1A:
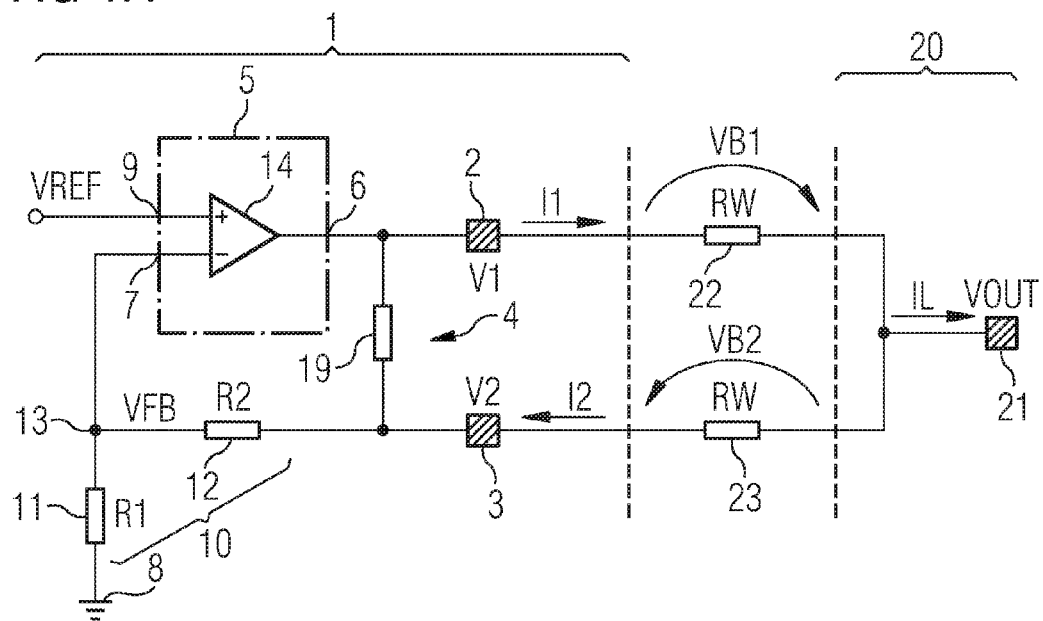
FIGS. 1A and 1B show schematics of two exemplary embodiments of arrangements comprising a semiconductor 1B according to the invention.

FIG. 1A shows a schematic of an exemplary embodiment of an arrangement comprising a semiconductor body 1 according to the invention. The semiconductor body 1 comprises a first and a second contact pad 2, 3, an impedance 4 and an integrated circuit 5. The semiconductor body 1 can be described as a die or a chip. The impedance 4 directly connects the first contact pad 2 to the second contact pad 3. The impedance 4 comprises a resistor 19. Thus the impedance 4 effects a resistive path between the first contact pad 2 and the second contact pad 3. The integrated circuit 5 comprises a first, a second and a third terminal 6, 7, 9. The first terminal 6 is directly connected to the first contact pad 2. The second terminal 7 is coupled to the second contact pad 3.

Furthermore, the semiconductor body 1 comprises a voltage divider 10 which couples the second contact pad 3 to a reference potential terminal 8. The voltage divider 10 comprises a first and a second divider resistor 11, 12 and a divider tap 13. The divider tap 13 is coupled to the reference potential terminal 8 via the first divider resistor 11 and to the second contact pad 3 via the second divider resistor 12. The divider tap 13 is directly connected to the second terminal 7 of the integrated circuit 5. The integrated circuit 5 comprises an amplifier 14. An output terminal of the amplifier 14 is connected to the first terminal 6. An inverting input terminal of the amplifier 14 is connected to the second terminal 7 and a non-inverting input terminal of the amplifier 14 is connected to the third terminal 9 of the integrated circuit 5. The arrangement further comprises a lead frame 20 with a lead finger 21. Furthermore, the arrangement comprises a first and a second bond wire 22, 23. The first bond wire 22 couples the lead finger 21 to the first contact pad 2 and the second bond wire 23 couples the lead finger 21 to the second contact pad 3.

A reference voltage VREF is applied to the third terminal 9 of the integrated circuit 5 and, therefore, to the non-inverting input terminal of the amplifier 14. The amplifier 14 and, therefore, the integrated circuit 5 provide a first voltage V1 to the first contact pad 2 via the first terminal 6 of the integrated circuit 5. By the first voltage V1, an output voltage VOUT is generated at the lead finger 21. A first current I1 flows from the first contact pad 2 to the lead finger 21 via the first bond wire 22. The first current I1 causes a first bond wire voltage VB1 between the first contact pad 2 and the lead finger 21. The output voltage VOUT can be approximately calculated according to the following equation:

$$VOUT = V1 - VB1 = V1 - RW \cdot I1,$$

wherein V1 is a value of the first voltage, VB1 is a value of the first bond wire voltage, I1 is a value of the first current and RW is a resistance value of the first bond wire 22. A second voltage V2 is provided at the second contact pad 3. The second voltage V2 is generated by the output voltage VOUT, because the second contact pad 3 is coupled to the lead finger 21 via the second bond wire 23, and also by the first voltage V1, since the second contact pad 3 is coupled to the first contact pad 2 via the impedance 4.

A feedback voltage VFB is generated at the divider tap 13 by means of the second voltage V2 and the voltage divider 10. A value of the feedback voltage VFB can be approximately calculated using the following equation:

$$VFB = \frac{R1}{R1 + R2} \cdot V2,$$

wherein V2 is a value of the second voltage, R1 is a resistance value of the first divider resistor 11 and R2 is a resistance value of the second divider resistor 12. The feedback voltage VFB is applied to the second terminal 7 of the integrated circuit 5 and, therefore, to the inverting input terminal of the amplifier 14.

The amplifier 14 generates the first voltage V1 with such a value, that the feedback voltage VFB is approximately equivalent to the reference voltage VREF. A second bond wire voltage VB2 can be measured between the lead finger 21 and the second contact pad 3. The second bond wire voltage VB2 is generated by a second current I2 which flows through the second bond wire 23. The second current I2 is caused by a small current flowing through the voltage divider 10. Since a load can be coupled to the lead finger 21, the first current I1 and consequently the first bond wire voltage VB1 may have values which are not zero. In an embodiment, the first current may have for example a value of 300 mA and the first bond wire 22 may have a resistance value RW of 0.1 Ohm leading to a first bond wire voltage VB1 of 30 mV. Because the current through the voltage divider 10 is much lower than 300 mA, the second bond wire voltage VB2 is much lower than 30 mV. The first and the second bond wires 22, 23 have approximately the same resistance value RW.

It is an advantage of the arrangement that a current flow through the feedback is so small that the feedback voltage VFB is provided with a good precision and is nearly generated without an influence of the first current I1. The feedback path couples the lead finger 21 to the second terminal 7 of the integrated circuit 5 via the second bond wire 23, the second contact pad 3 and the voltage divider 10. Since a resistance value RA of the impedance 4 preferably is much higher than the resistance value RW of the second bond wire 23, the second voltage V2 mainly depends on the output voltage VOUT and there is only a small influence from the first voltage V1 via the coupling of the two contact pads 2, 3 via the impedance 4.

A load current IL may flow through the lead finger 21. The influence of the load current IL on the output voltage VOUT is advantageously minimised by the second bond wire 23. In case the load current IL has a very low value, the output voltage VOUT can be approximately calculated by the following equation:

$$VOUT = VREF \cdot \left(1 + \frac{R2}{R1} + \frac{RW}{R1} \cdot \frac{RA + RW}{RA + 2 \cdot RW}\right),$$

wherein VREF is a value of the reference voltage, R1 and R2 are the resistance values of the first and the second divider resistors 11, 12, RW is the resistance value of the first and the second bond wires 22, 23 and RA is the resistance value of the impedance 4. Preferably, the resistance RA of the impedance 4 is larger than the resistance value RW of the first and second bond wires 22, 23, so that the output voltage VOUT can be approximately calculated using the following equation:

$$VOUT = VREF \cdot \frac{R1 + R2 + RW}{R1}$$

Figure 1B:
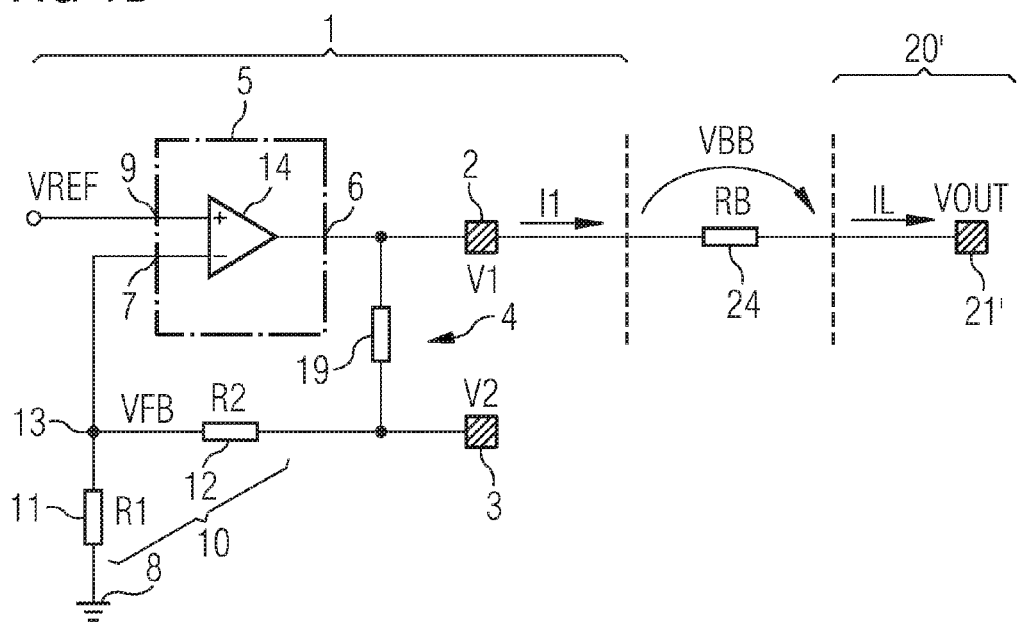

FIG. 1B shows a schematic of an exemplary embodiment of an alternative arrangement according to the invention. The arrangement according to FIG. 1B comprises the same semiconductor body 1 as in FIG. 1A. The arrangement according to FIG. 1B comprises a lead frame 20' with a lead finger 21'. The lead finger 21' is directly connected to the first contact pad 2. The connection may comprise a bump 24 which is arranged between the lead finger 21' and the first contact pad 2. According to the arrangement in FIG. 1B, there is no direct connection between the lead finger 21' and the second contact pad 3.

Since a resistance value RB of the bump 24 is very low, the first current I1 causes only a negligible bump voltage VBB between the first contact pad 2 and the lead finger 21'. The feedback voltage VFB is generated by the first voltage V1, the voltage divider 10 and the impedance 4 and can be approximately calculated according to the following equation:

$$VFB = \frac{R1}{R1 + R2 + RA} \cdot V1,$$

wherein R1 and R2 are the resistance values of the first and the second divider resistors 11, 12, RA is the resistance value of the impedance 4 and V1 is the value of the first voltage. Since the resistance value RB of the bump 24 is very small, the output voltage VOUT is approximately equal to the first voltage V1. The output voltage VOUT, therefore, can be calculated according to the following equation:

$$VOUT = VREF \cdot \frac{R1 + R2 + RA}{R1},$$

wherein VREF is the value of the reference voltage. The resistance value RA of the impedance 4 is preferably chosen very small in comparison to the resistance value R1 of the first divider resistor 11. In an embodiment, the resistance value RA is about 100 Ohm, while the resistance value R1 equals about 100 kOhm. Consequently, the resistance value RA has only a small influence on the output voltage VOUT.

It is an advantage of the arrangement that only one bump 24 is necessary for the connection of the semiconductor body 1 to the lead finger 21'. The connection of the first contact pad 2 to the lead finger 21' can thus be realized with a very low resistance value. The impedance 4 advantageously provides the feedback path. The arrangement can be realized at lower cost compared with an arrangement comprising a second bump and a second lead finger as well as a short circuit of the lead finger 21' and the second lead finger, for example on a printed circuit board.

It is an advantage that the two contact pads 2, 3 are suitable to be contacted by wire bonding and are also suitable to be contacted by flip-chip bonding. It is not necessary to design one version of the semiconductor body 1 for wire bonding and another version of the semiconductor body 1 for flip-chip packaging. The output voltage VOUT mainly depends on the first and the second divider resistors 11, 12 and the reference voltage VREF in both arrangements shown in FIGS. 1A and 1B. Even if a high load current IL flows, the output voltage VOUT is advantageously provided with high accuracy in the arrangements shown in FIGS. 1A and 1B. Preferably, the impedance 4 has a resistance value RA according to the following equation:

$$RW < RA < R1,$$

wherein RW is the resistance value of each of the bond wires 22, 23 and R1 is the resistance value of the first divider resistor 11. Thus, the electrical performance of the arrangement comprising the flip-chip package and the electrical performance of the arrangement comprising the bond wire package are advantageously practically equal.

Figure 2A:
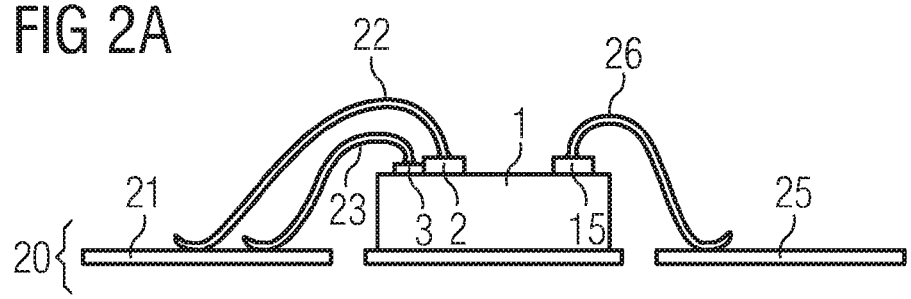
FIGS. 2A to 2D show exemplary embodiments of lateral views of the arrangements shown in FIGS. 1A and 1B according to the invention.

FIG. 2A shows an exemplary lateral view of the arrangement shown in FIG. 1A according to the invention. The lateral view shows the semiconductor body 1, the first bond wire 22 which connects the first contact pad 2 to the lead finger 21 and the second bond wire 23 which connects the second contact pad 3 to the lead finger 21. This arrangement can comprise further bond pads in addition to bond pads 2, 3. For example, a further lead finger 25 and a further bond wire 26 are provided for contacting a further contact pad 15 comprised by the semiconductor body 1.

Figure 2B:
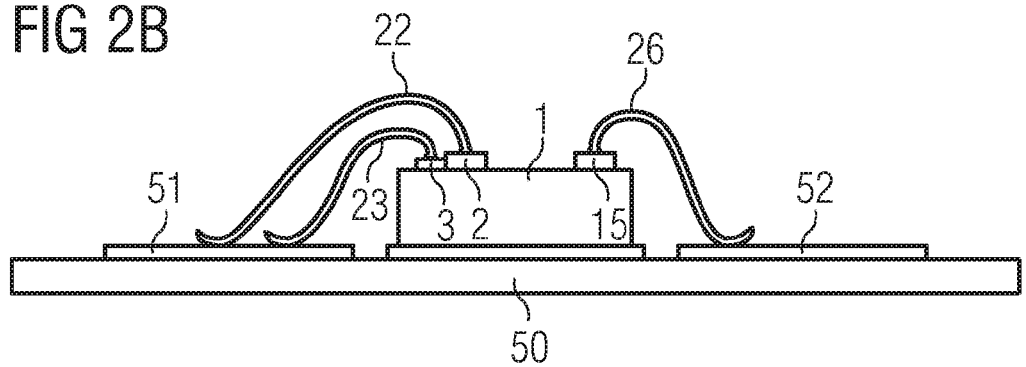

FIG. 2B shows an exemplary lateral view of an embodiment according to the invention which is a further development of the arrangement shown in FIGS. 1A and 2A. The arrangement comprises a printed circuit board 50, abbreviated PCB, with a metallization line 51 and the semiconductor body 1 which is arranged on the PCB 50. The first bond wire 22 connects the first contact pad 2 to the metallization line 51, whereas the second bond wire 23 connects the second contact pad 3 to the metallization line 51. The metallization line 51 contains copper. The PCB 50 can comprise a further metallization line 52. The further bond wire 26 connects the further contact pad 15 and the further metallization line 52.

In an embodiment, the first metallization line 51 comprises a first terminal area, which is not shown and whereto the first and the second bond wire 22, 23 are attached. In an alternative embodiment, the first metallization line 51 comprises the first terminal area for the connection of the first bond wire 22 and a second terminal area, which is not shown in FIG. 2B, for the attachment of the second bond wire 23.

Figure 2C:
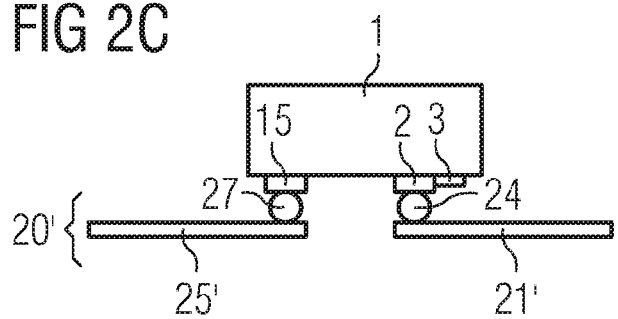

FIG. 2C shows an exemplary lateral view of the arrangement shown in FIG. 1B according to the invention. The lateral view shows the semiconductor body 1 comprising the first and the second contact pads 2, 3. The arrangement comprises the lead frame 20' with the lead finger 21'. The lead finger 21' is coupled to the first contact pad 2 via the bump 24. The bump 24 can be realized as a ball. The lead frame 20' can comprise a further lead finger 25' which is connected to the further contact pad 15 via a further bump 27. Therefore, there is no direct contact between the second contact pad 3 and the lead frame 20'.

Figure 2D:
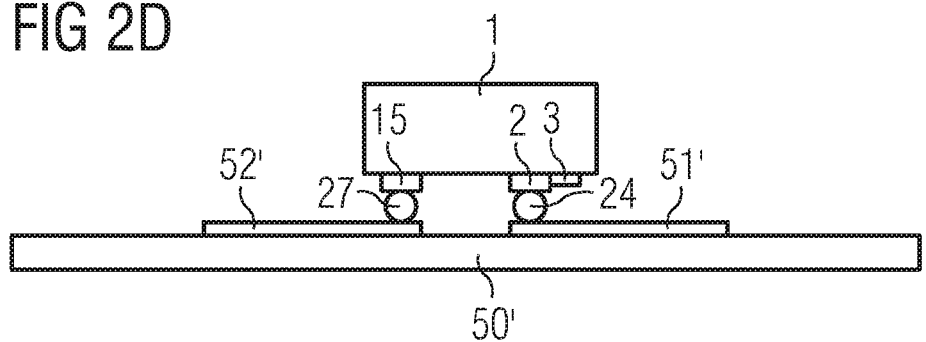

FIG. 2D shows an exemplary lateral view of an embodiment according to the invention which is a further development of the arrangement shown in FIGS. 1B and 2C. The arrangement comprises the printed circuit board 50' with the metallization line 51'. The semiconductor body 1 is arranged on the PCB 50' with a flip-chip method. The first contact pad 2 is connected to the metallization line 51' via the bump 24. The second contact pad 3, however, is not directly connected to the metallization line 51'. The arrangement can comprise a further metallization line 52' of the PCB 50' which is connected to the further contact pad 15 via the further bump 27.

In an embodiment, the first metallization line 51 comprises the first terminal area, which is not shown, for the attachment of the bump 24.

Figure 3A:
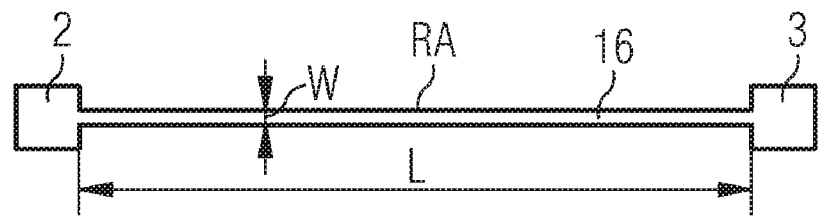
FIGS. 3A to 3D show exemplary embodiments of an impedance.

FIG. 3A shows an exemplary embodiment of the impedance 4 which can be inserted into the arrangements shown in FIGS. 1A and 1B. The impedance 4 according to FIG. 3A comprises a metallization line 16 which couples the first contact pad 2 to the second contact pad 3. The metallization line 16 has a resistance value RA according to the following equation:

$$RA = \frac{L}{W \cdot D} \cdot \rho,$$

wherein $\rho$ is a value of the resistivity of the metal of the metallization line 16, L is a length, W is a width and D is a thickness of the metallization line 16. At a given resistivity and thickness, the length L and the width W are advantageously designed in such a way that the resistance value RA is larger than the resistance value RW of the first and the second bond wires 22, 23. Therefore, the metallization line 16 connects the first contact pad 2 to the second contact pad 3. Thus, a resistive path between the first contact pad 2 and the second contact pad 3 is provided by the metallization line 16.

Figure 3B:
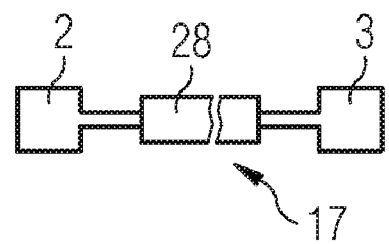

FIG. 3B shows an alternative embodiment of the impedance 4 which can be inserted into the semiconductor body shown in FIGS. 1A and 1B. The impedance 4 according to FIG. 3B comprises a fuse 17. The fuse 17 is realized using a resistive fuse element 28. The fuse 17 is shown in a burnt state. The fuse 17 can be burnt using the first and the second contact pads 2, 3 and a voltage source.

Figure 3C:
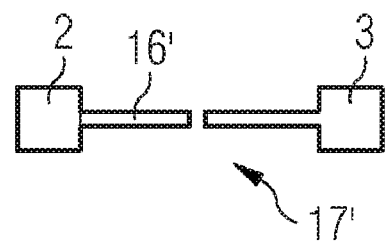

FIG. 3C shows an alternative embodiment of the impedance 4 which can be inserted into the semiconductor body 1 according to FIGS. 1A and 1B. FIG. 3C also shows a fuse 17'. The fuse 17' is realized using a metallization line 16'. The fuse 17' is shown in a programmed state. The programming is performed using a laser cut of the metallization line 16'.

Figure 3D:
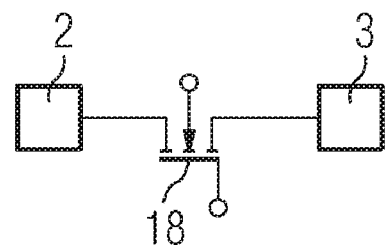

FIG. 3D shows an alternative embodiment of the impedance 4 which can be inserted into the semiconductor body 1 according to FIGS. 1A and 1B. The impedance 4 comprises a switch 18. The switch 18 is designed as a transistor. The switch 18 connects the first contact pad 2 to the second contact pad 3. The switch 18 provides a resistive path between the first contact pad 2 and the second contact pad 3.

The fuse 17, 17' and the switch 18 are advantageously in a low resistance state if the semiconductor body 1 is inserted in a flip-chip package and are advantageously in a high impedance state if the semiconductor body 1 is packaged by means of the bond wires 22, 23. The fuse 17, 17' and the switch 18 are arranged between the first contact pad 2 and the second contact pad 3. If the fuse 17, 17' and the switch 18 are in a low resistance state, they effect a resistive path between the first contact pad 2 and the second contact pad 3. The transistor is preferably realized as a metal-oxide-semiconductor field-effect transistor.

Figure 4A:
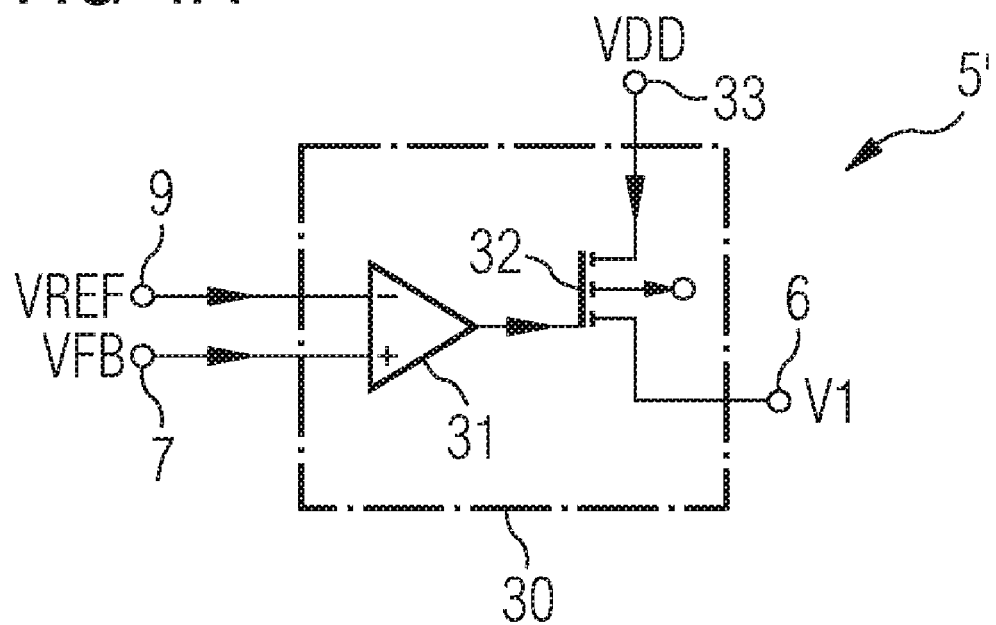
FIGS. 4A and 4B show exemplary embodiments of an integrated circuit.

FIG. 4A shows an exemplary alternative embodiment 5' of the integrated circuit 5 in the semiconductor body 1, shown in FIGS. 1A and 1B. The integrated circuit 5' according to FIG. 4A comprises a voltage regulator 30 having an amplifier 31 and a transistor 32. The transistor 32 is a p-channel metal-oxide-semiconductor field-effect transistor. A inverting input terminal of the amplifier 31 is connected to the third terminal 9 of the integrated circuit 5', a non-inverting input terminal of the amplifier 31 is connected to the second terminal 7 of the integrated circuit 5' and an output terminal of the amplifier 31 is connected to a control terminal of the transistor 32. The transistor 32 couples a supply voltage terminal 33 to the first terminal 6 of the integrated circuit 5'. The voltage regulator 30 is realized as a low-dropout voltage regulator. A supply voltage VDD is provided at the supply voltage terminal 33. The feedback path is either provided according to the arrangement shown in FIG. 1A or according to the arrangement shown in FIG. 1B and yields in a very stable output voltage VOUT.

Figure 4B:
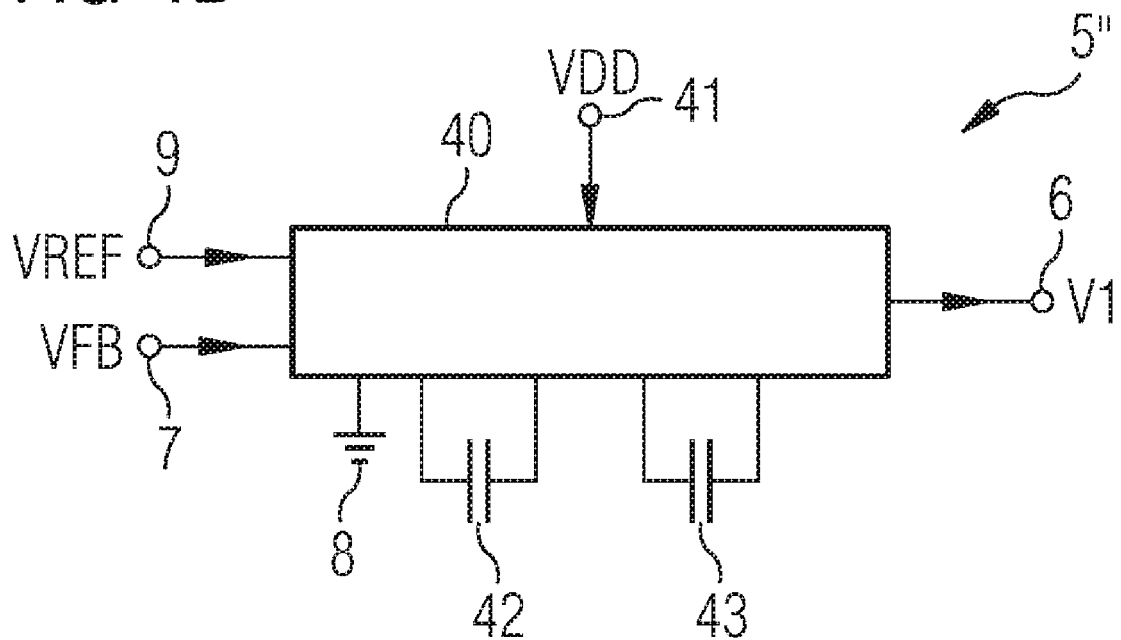

FIG. 4B shows an alternative embodiment of an integrated circuit 5" which can be inserted into the semiconductor body 1 shown in FIGS. 1A and 1B. The integrated circuit 5" according to FIG. 4B comprises a direct current/current converter 40, abbreviated DC/DC converter. The DC/DC converter 40 comprises an input terminal which is connected to a supply voltage terminal 41, an output terminal which is coupled to the first terminal 6, a feedback terminal which is coupled to the second terminal 7 and a reference terminal which is coupled to the third terminal 9 of the integrated circuit 5". A first and a second capacitor 42, 43 are coupled to the DC/DC converter 40. The DC/DC converter 40 uses a charge pump principle. The DC/DC converter 40 provides the first voltage V1 depending on the reference voltage VREF and the feedback voltage VFB. Through the arrangements shown in FIGS. 1A and 1B, the output voltage VOUT can advantageously be provided with a high accuracy.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An arrangement comprising:
    a semiconductor body, comprising:
        a first contact pad;
        a second contact pad;
        an integrated circuit with a first terminal coupled to the first contact pad and with a second terminal coupled to the second contact pad;
        an impedance coupling the first contact pad to the second contact pad via a resistive path between the first contact pad and the second contact pad;
    a lead frame with a lead finger;
    a first bond wire between the first contact pad and the lead finger; and
    a second bond wire between the second contact pad and the lead finger.

2. The arrangement according to claim 1, wherein the first contact pad and the second contact pad are configured to provide an external electrical contact to the semiconductor body, respectively.

3. The arrangement according to claim 1, wherein the first contact pad and the second contact pad comprise bond pads.

4. The arrangement according to claim 1, wherein the impedance directly connects the first contact pad to the second contact pad.

5. The arrangement according to claim 1, wherein the impedance comprises one of a resistor, a metallization line, a fuse and a switch.

6. The arrangement according to claim 1, wherein the first terminal of the integrated circuit is an output terminal of the integrated circuit, the second terminal of the integrated circuit is a feedback terminal of the integrated circuit and a third terminal of the integrated circuit is a reference input terminal to receive a reference voltage.

7. The arrangement according to claim 1, further comprising:
    a voltage divider arranged between the second contact pad and a reference potential terminal and comprising a divider tap coupled to the second terminal of the integrated circuit.

8. The arrangement according to claim 7, wherein the voltage divider comprises a first divider resistor which couples the divider tap to the reference potential terminal, and the impedance has a resistance value RA according to the relationship:

$$RW < RA < R1,$$

wherein RW is a resistance value of a bond wire to be connected to at least one of the first contact pad and the second contact pad, and R1 is a resistance value of the first divider resistor.

9. The arrangement according to claim 1, wherein the integrated circuit comprises one of a voltage regulator, an amplifier, and a direct current/direct current converter.

10. A method for voltage regulation, comprising the steps of:
    supplying a first voltage to a first contact pad coupled to a lead finger via a first bond wire, an output voltage being provided at the lead finger depending on the first voltage;
    providing a second voltage at a second contact pad depending on an impedance provided between the first contact pad and the second contact pad and on the first voltage, the impedance coupling the first contact pad to the second contact pad via a resistive path between the first contact pad and the second contact pad, the second voltage depending on an electrical connection between the lead finger and the second contact pad, and a second bond wire electrically connecting the lead finger to the second contact pad;
    generating a feedback voltage by the second voltage; and
    generating the first voltage depending on the feedback voltage and on a reference voltage;
    wherein the first and second contact pads are on a semiconductor body.

* * * * *